United States Patent
Boyd et al.

(10) Patent No.: US 8,330,072 B2
(45) Date of Patent: Dec. 11, 2012

(54) SYSTEM METHOD AND APPARATUS FOR DRY-IN, DRY-OUT, LOW DEFECT LASER DICING USING PROXIMITY TECHNOLOGY

(75) Inventors: John M. Boyd, Atascadero, CA (US); Fred C. Redeker, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 408 days.

(21) Appl. No.: 12/687,106

(22) Filed: Jan. 13, 2010

(65) Prior Publication Data

US 2010/0108652 A1 May 6, 2010

Related U.S. Application Data

(60) Division of application No. 11/016,381, filed on Dec. 16, 2004, now Pat. No. 7,675,000, which is a continuation-in-part of application No. 10/606,022, filed on Jun. 24, 2003, now Pat. No. 7,252,097.

(51) Int. Cl.
*B23K 26/14* (2006.01)
*B23K 26/16* (2006.01)
(52) U.S. Cl. .......... 219/121.67; 219/121.72; 219/121.84
(58) Field of Classification Search ............ 219/121.67, 219/121.72, 121.84, 121.85
See application file for complete search history.

(56) References Cited

U.S. PATENT DOCUMENTS 6,488,040 B1 * 12/2002 de Larios et al. ............ 134/95.2
6,555,017 B1 * 4/2003 Rushford et al. ............... 216/84

FOREIGN PATENT DOCUMENTS

WO    WO0175966    * 10/2001

* cited by examiner

*Primary Examiner* — M. Alexandra Elve
(74) *Attorney, Agent, or Firm* — Martine Penilla Group, LLP

(57) ABSTRACT

A substrate processing system includes a first, movable surface tension gradient device, a dicing device and a system controller. The first, movable surface tension gradient device is capable of supporting a first process within a first meniscus. The first meniscus being supported between the first surface tension gradient device and a first surface of the substrate. The first movable surface tension gradient device capable of being moved relative to the first surface of the substrate. The dicing device is oriented to a desired dicing location. The desired dicing location being encompassed by the meniscus. The system controller is coupled to the dicing device and the surface tension gradient device. The system controller includes a process recipe. A method for dicing a substrate is also described. The method of dicing a substrate including placing a substrate in a substrate dicing system, forming a meniscus between a proximity head and a first surface of the substrate, dicing the substrate at a desired dicing location and simultaneously capturing any particles and contaminants generated by dicing the substrate within the meniscus, the meniscus including the desired dicing location and moving the meniscus in a desired dicing direction.

12 Claims, 15 Drawing Sheets

SYSTEM METHOD AND APPARATUS FOR DRY-IN, DRY-OUT, LOW DEFECT LASER DICING USING PROXIMITY TECHNOLOGY

CROSS REFERENCE TO RELATED APPLICATIONS

This application is a divisional of and claims priority from U.S. patent application Ser. No. 11/016,381 filed on Dec. 16, 2004 now U.S. Pat. No. 7,675,000 and entitled "System, Method and Apparatus for Dry-In, Dry-Out, Low Defect Laser Dicing Using Proximity Technology," by Boyd et al., which is incorporated herein by reference in its entirety for all purposes. The present application and U.S. patent application Ser. No. 11/016,381 are continuation-in-part of and claim priority from U.S. patent application Ser. No. 10/606,022 filed on Jun. 24, 2003 now U.S. Pat. No. 7,252,097 and entitled "System and Method for Integrating In-Situ Metrology Within a Wafer Process," by Boyd et al., which is incorporated herein by reference in its entirety for all purposes.

BACKGROUND OF THE INVENTION

1. Field of the Invention

The present invention relates generally to dicing substrates, and more particularly, to methods and systems for simultaneously cleaning and dicing substrates.

2. Description of the Related Art

Integrated circuits are formed through many processes applied sequentially to a semiconductor wafer or substrate. Typically multiple integrated circuits are formed on a single substrate. Each of the integrated circuits is confined to an area referred to as a die or an integrated circuit die. Typically a small region of unused space remains between the integrated circuit dies within which no devices required by the integrated circuits are formed. This unused space is typically referred to as the scribe channel. The dies are separated by cutting the substrate through the scribe channel after the multiple integrated circuit dies are formed. Separating the dies is referred to as dicing or die singulation.

The substrate can be diced using several different approaches. On approach is with an abrasive circular saw that grinds through the substrate along the scribe channel. Another approach is by scoring the substrate with a sharp or abrasive tool along the scribe channels and then breaking the substrate along the score lines drawn. Yet another approach is to cut or score the substrate with a laser. The dicing process can be a partial dicing, where the substrate is not cut all the way through. Alternatively, dicing can be full dicing, where the substrate is cut all the way through.

One laser technology used for dicing the substrate can be referred to as a water-jet-guided laser such as may be available from Synova SA of Ecublens, Switzerland. Synova's water-jet guided laser directs a stream (i.e., jet) of water along the scribe channel on the surface of the substrate and focuses a laser at the point where the water jet meets the surface of the substrate. The water jet can also encompass the laser light. As the laser light cuts (either fully or partially) into the substrate, the water jet carries away any dicing by-products (i.e., swarf) such as particles. Further, the water from the water jet tends to spread out over the surrounding surface of the substrate and thereby somewhat limit or at least reduce the adhesion of the particles to the surrounding surface of the substrate.

Unfortunately, the water-jet-guided laser is a wet process and the resulting dies must then be thoroughly cleaned of any particle contamination. Both front side (the side of the die with the integrated circuit formed thereon) and the back side (the side opposite the front side) of each and every die must be cleaned. After the front and back sides of each of the dies are cleaned, both the front and back sides of the dies must also be dried. This cleaning and drying process requires additional processing and handling of the dies after the dicing. During this additional processing and handling the dies can be damaged and/or process problems can occur. In view of the foregoing, there is a need for a system and method of dicing integrated circuits without the need of a subsequent cleaning and drying process.

SUMMARY OF THE INVENTION

Broadly speaking, the present invention fills these needs by providing a system and method for dicing substrates without the need of a subsequent cleaning and drying process. It should be appreciated that the present invention can be implemented in numerous ways, including as a process, an apparatus, a system, computer readable media, or a device. Several inventive embodiments of the present invention are described below.

One embodiment provides a substrate processing system that includes a first, movable surface tension gradient device, a dicing device and a system controller. The first, movable surface tension gradient device is capable of supporting a first process within a first meniscus. The first meniscus being supported between the first surface tension gradient device and a first surface of the substrate. The first movable surface tension gradient device capable of being moved relative to the first surface of the substrate. The dicing device is oriented to a desired dicing location. The desired dicing location being encompassed by the meniscus. The system controller is coupled to the dicing device and the surface tension gradient device.

The process includes at least one of a group of processes consisting of a cleaning process, a rinsing process, an etch process, a deposition process, and an electroplating process. Supporting the process can include flowing a process fluid through the meniscus.

Supporting the process can also include moving the meniscus relative to the first surface of the substrate. Moving the meniscus relative to the first surface of the substrate can include drying the first surface. The dicing device can include a laser. The laser can include a water-jet laser.

The surface tension gradient device includes a proximity head. The meniscus can include a dry region substantially surrounding the desired dicing location. The dicing device can be moved with the surface tension gradient device.

The dicing device can be moved independent from the surface tension gradient device. The system can also include a sensor capable of monitoring the desired dicing location.

The system can also include a dicing target supported on a second surface of the substrate. The second surface being opposite the first surface. The dicing target being supported in a position corresponding to the desired dicing location. The dicing device can be a laser and the dicing target can be a laser absorbing target.

The system can also include a second, movable surface tension gradient device capable of supporting a second process within a second meniscus. The second meniscus being supported between the second surface tension gradient device and a second surface of the substrate. The second surface being opposite the first surface. The second movable surface tension gradient device capable of being moved relative to the second surface of the substrate.

Another embodiment provides a method of dicing a substrate. The method includes placing a substrate in a substrate dicing system and forming a meniscus between a proximity head and a first surface of the substrate. The substrate can be diced at a desired dicing location and any particles and contaminants generated by dicing the substrate can be simultaneously captured within the meniscus. The meniscus including the desired dicing location. The meniscus can be moved in a desired dicing direction.

Moving the moving the meniscus in the desired dicing direction can include drying the first surface of the substrate. Dicing the substrate can include a partial dicing. Dicing the substrate can include applying a laser to the desired dicing location. Applying the laser can include applying the laser through the meniscus.

The meniscus can be an annular meniscus and includes a dry central region and wherein applying the laser can include applying the laser through dry central region of the meniscus.

Dicing the substrate includes a full dicing. The method can also include forming a second meniscus between a second surface of the substrate. The second surface being opposite from the first surface of the substrate. Dicing the substrate at the desired dicing location can include simultaneously capturing any particles and contaminants generated by dicing the substrate within the second meniscus.

Moving the first meniscus in the desired dicing direction can include moving the second meniscus. Dicing the substrate can include applying a laser to the desired dicing location and absorbing the laser in a laser absorbing target near the second surface of the substrate.

Yet another embodiment provides a substrate processing system. The substrate processing system includes a first proximity head, a dicing laser source, a second proximity head, a laser absorbing target, and a system controller. The first proximity head being capable of supporting a first process within a first meniscus. The first meniscus being supported between the first proximity head and a first surface of the substrate. The first proximity head capable of being moved relative to the first surface of the substrate. The dicing laser source is oriented to direct a laser to a desired dicing location. The desired dicing location being encompassed by the first meniscus. The second proximity head is capable of supporting a second process within a second meniscus. The second meniscus being supported between the second proximity head and a second surface of the substrate. The second surface being opposite the first surface. The second proximity head capable of being moved relative to the second surface of the substrate. The laser absorbing target capable of being supported in a position corresponding to the desired dicing location. The system controller being coupled to the dicing laser source and the first and second proximity heads. The system controller including a process recipe.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for a system and method for dicing substrates without the need of a subsequent cleaning and drying process will now be described. It will be apparent to those skilled in the art that the present invention may be practiced without some or all of the specific details set forth herein.

The present invention provides a system that combines a proximity head supporting a dynamic liquid meniscus with a dicing laser. In this system substantially all of the particles generated by the laser are immediately removed from the surface of the substrate by the dynamic flow of the fluid in the meniscus. Further, the dynamic liquid meniscus performs a cleaning and/or rinsing process and a drying process simultaneously with the laser dicing process thereby providing a dry-in dry-out substrate dicing process. Further still, the fluid (i.e., DIW) used to form the dynamic liquid meniscus can be recaptured, filtered to remove particles or other contaminants and reused, thereby reducing a potentially costly waste water stream. As the dicing laser can operate through a fluid, the dicing laser can be applied either through a meniscus or through an opening in an annular meniscus.

The system described herein improves the dicing process by reducing defects (e.g., particle contamination, handling errors, etc.), reducing process steps, reducing cycle time and reducing a waste water stream.

Part 1: Dynamic Liquid Meniscus

Figure 1:
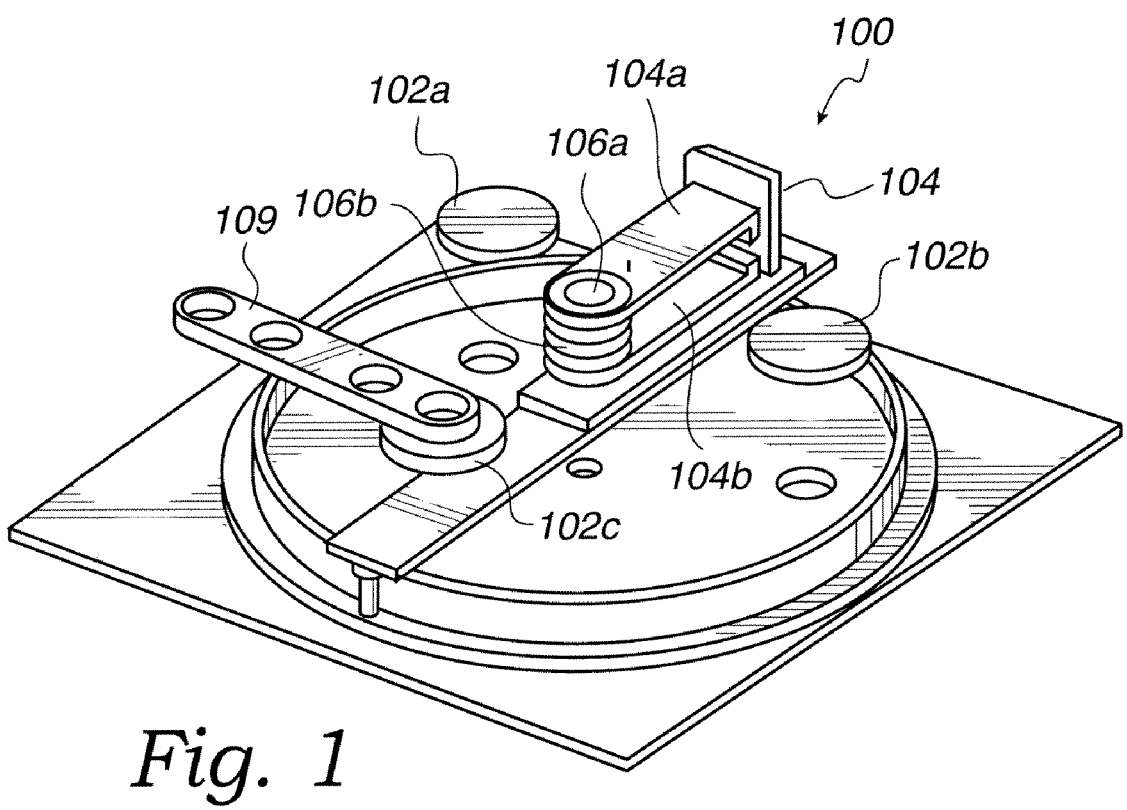
FIG. 1 shows a wafer processing system, in accordance with one embodiment of the present invention.

FIG. 1 shows a wafer processing system 100, in accordance with one embodiment of the present invention. The system 100 includes rollers 102a, 102b, and 102c which may hold and rotate a wafer to enable wafer surfaces to be processed. The system 100 also includes proximity heads 106a and 106b that, in one embodiment, are attached to an upper arm 104a and to a lower arm 104b respectively. The upper arm 104a and the lower arm 104b are part of a proximity head carrier assembly 104 which enables substantially linear movement of the proximity heads 106a and 106b along a radius of the wafer.

In one embodiment the proximity head carrier assembly 104 is configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. The upper arm 104a and the lower arm 104b may be configured in any suitable way so the proximity heads 106a and 106b can be moved to enable wafer processing as described herein.

It should be appreciated that the system 100 may be configured in any suitable manner as long as the proximity head(s) may be moved in close proximity to the wafer to generate and control a dynamic liquid meniscus as discussed below in reference to FIGS. 4 through 6B. It should also be understood that close proximity may be any suitable distance from the wafer as long as a dynamic liquid meniscus as discussed in further reference to FIGS. 4 through 6B may be maintained. In one embodiment, the proximity heads 106a and 106b (as well as any other proximity head described herein) may each be moved to between about 0.1 mm to about 10 mm from the wafer to initiate wafer processing operations. In a preferable embodiment, the proximity heads 106a and 106b (as well as any other proximity head described herein) may each be moved to between about 0.5 mm to about 4.5 mm from the wafer to initiate wafer processing operations, and in more preferable embodiment, the proximity heads 106a and 106b (as well as any other proximity head described herein) may be moved to about 2 mm from the wafer to initiate wafer processing operations.

The system 100, in one embodiment, has the proximity head carrier assembly 104 that is configured to enable the proximity heads 106a and 106b to be moved from the center of the wafer towards the edge of the wafer. It should be appreciated that the proximity head carrier assembly 104 may be movable in any suitable manner that would enable movement of the proximity heads 106a and 106b to process (e.g., etch, clean, rinse, dry etc.) the wafer, as desired. In one embodiment, the proximity head carrier assembly 104 can be motorized to move the proximity head 106a and 106b from the center of the wafer to the edge of the wafer. It should be understood that although the wafer processing system 100 is shown with two proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The proximity heads 106a and 106b can also be configured to move independently of one another such that each of the proximity heads can be over different portions of the surface of the wafer 108.

The different configurations described herein generate a dynamic liquid meniscus between the proximity head and the wafer. By way of example, the dynamic liquid meniscus may be moved across the wafer to clean and dry the wafer by applying fluid to the wafer surface and removing the fluids from the wafer surface. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer. It should also be appreciated that the fluid used to form and support the dynamic liquid meniscus can be added and withdrawn through the dynamic liquid meniscus so as to constitute a flow through the dynamic liquid meniscus. The fluid flowing through the meniscus can be any suitable type of fluid desired to perform the desired process (e.g., etch, clean, rinse, electroplate, etc.) The dynamic liquid meniscus also dries the surface of the substrate as the dynamic liquid meniscus is drawn away from the surface.

In addition, besides processing both the top and bottom surfaces and of the wafer, the system 100 may also be configured to perform different processes on each side of the wafer if desired by inputting and outputting different types of fluids to each of the respective sides of the wafer. By way of example the system 100 can clean the front side of the wafer and dry the back side of the wafer. It should be appreciated that the system 100 may utilize the application of different chemicals top and bottom in the proximity heads 106a and 106b respectively depending on the operation desired. The proximity heads can be configured to process the bevel edge of the wafer in addition to processing the top and/or bottom of the wafer. This can be accomplished by moving the meniscus off the edge the wafer that cleans the bevel edge. It should also be understood that the proximity heads 106a and 106b may be the same type of apparatus or different types of proximity heads.

Figure 2:
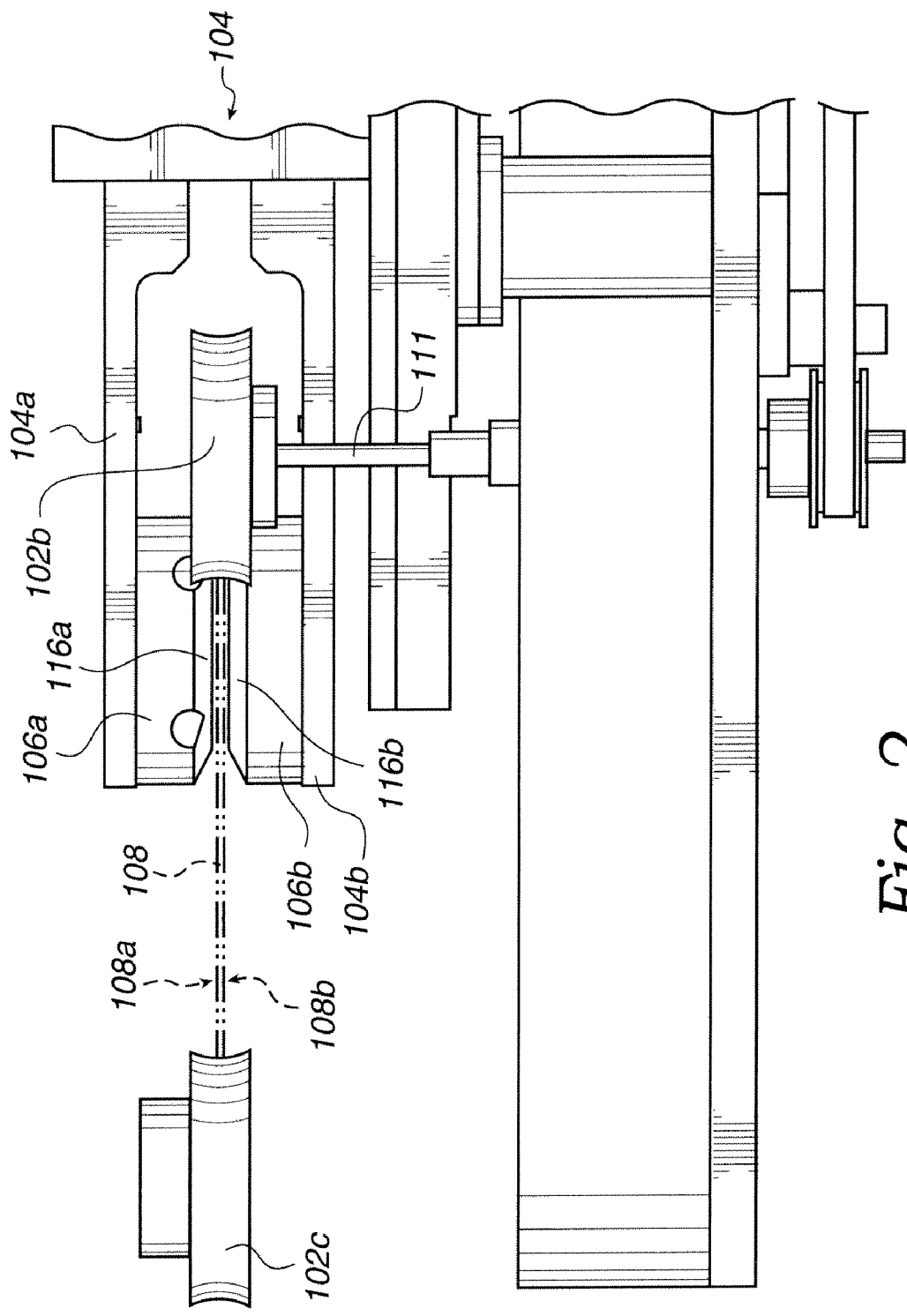
FIG. 2 is a side close-up side view of the wafer processing system, in accordance with one embodiment of the present invention.

FIG. 2 is a side close-up side view of the wafer processing system 100, in accordance with one embodiment of the present invention. The wafer processing system 100 is shown holding a wafer 108. The wafer 108 may be held and rotated by the rollers 102a, 102b, and 102c in any suitable orientation as long as the orientation enables a desired proximity head to be in close proximity to a portion of the wafer 108 that is to be processed. In one embodiment, the roller 102b may be rotated by using a spindle 111, and the roller 102c may be held and rotated by a roller arm 109. The roller 102a may also be rotated by its own spindle. In one embodiment, the rollers 102a, 102b, and 102c can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a, 102b, and 102c serves to move a wafer area that has not been processed into close proximity to the proximity heads 106a and 106b. In an exemplary drying operation, the wet areas of the wafer would be presented to the proximity heads 106a and 106b through both the linear motion of the proximity heads 106a and 106b and through the rotation of the wafer 108. The drying or cleaning operation itself is conducted by at least one of the proximity heads. Consequently, in one embodiment, a dry area of the wafer 108 would expand from a center region to the edge region of the wafer 108 in a spiral movement as a drying operation progresses. In a preferable embodiment, the dry area of the wafer 108 would move around the wafer 108 and the wafer 108 would be dry in one rotation (if the length of the proximity heads 106*a* and 106*b* are at least a radius of the wafer 108). By changing the configuration of the system 100 and the orientation of and movement of the proximity head 106*a* and/or the proximity head 106*b*, the drying movement may be changed to accommodate nearly any suitable type of drying or cleaning or other process path.

It should be understood that the proximity heads 106*a* and 106*b* may be configured to have at least one of first source inlet configured to input deionized water (DIW) or other process chemistry (also known as a DIW inlet), at least one of a second source inlet configured to input isopropyl alcohol (IPA) in vapor form (also known as IPA inlet), and at least one source outlet configured to output fluids from a region between the wafer and a particular proximity head by applying vacuum (also known as vacuum outlet). It should be appreciated that the vacuum utilized herein may also be suction. In addition, other types of solutions may be inputted into the first source inlet and the second source inlet such as, for example, etching chemistries, photoresist wet stripping chemistries, cleaning solutions, ammonia, HF, etc. It should be appreciated that although IPA vapor is used in some of the exemplary embodiments, other tensio-active substance (substances that provide or increase or decrease a surface tension gradient between a substrate-liquid interface) and nitrogen or other inert carrier gas may be used to carry the tension-active vapor. Alternatives for IPA include but are not limited to the following: diacetone, diaceton alcohol, 1-methoxy-2-propanol, ethylglycol, methyl-pyrrolidon, ethyllactate, 2-butanol. In addition, any other type of vapor or gas may be utilized such as for example, nitrogen, argon or other gases, any suitable alcohol vapor, organic compounds, etc. that may be miscible with water.

In one embodiment, the at least one IPA vapor inlet is adjacent to the at least one vacuum outlet which is in turn adjacent to the at least one DIW inlet to form an IPA-vacuum-DIW orientation. It should be appreciated that other types of orientations such as IPA-DIW-vacuum, DIW-vacuum-IPA, vacuum-IPA-DIW, etc. may be utilized depending on the wafer process that is sought to be enhanced. In a preferable embodiment, the IPA-vacuum-DIW orientation may be utilized to intelligently generate, control, and move the meniscus located between a proximity head and a wafer to clean and dry wafers. The DIW inlets, the IPA vapor inlets, and the vacuum outlets may be arranged in any suitable manner if the above orientation is maintained. For example, in addition to the IPA vapor inlet, the vacuum outlet, and the DIW inlet, in an additional embodiment, there may be additional sets of IPA vapor outlets, DIW inlets and/or vacuum outlets depending on the configuration of the proximity head desired. Therefore, another embodiment may utilize an IPA-vacuum-DIW-DIW-vacuum-IPA or other exemplary embodiments with an IPA source inlet, vacuum source outlet, and DIW source inlet configurations are described herein with a preferable embodiment being described in reference to FIG. 4. It should be appreciated that the exact configuration of the IPA-vacuum-DIW orientation may be varied depending on the application. For example, the distance between the IPA input, vacuum, and DIW input locations may be varied so the distances are consistent or so the distances are inconsistent. In addition, the distances between the IPA input, vacuum, and DIW output may differ in magnitude depending on the size, shape, and configuration of the proximity head 106*a* and the desired size and shape of a processing meniscus. In addition, the IPA-vacuum-DIW orientation is configured so a vacuum region substantially surrounds a DIW region and the IPA region substantially surrounds at least the trailing edge region of the vacuum region.

In another embodiment, the proximity heads 106*a* and 106*b* can be positioned in close proximity to a top surface 108*a* and a bottom surface 108*b* of the wafer 108 respectively by utilization of the proximity head carrier assembly 104. Once in this position, the proximity heads 106*a* and 106*b* may utilize the IPA and DIW source inlets and a vacuum source outlet(s) to generate wafer processing meniscuses 116A and 116B in contact with the wafer 108 which are capable of applying and removing fluids from a top surface 108*a* and a bottom surface 108*b*. The wafer processing meniscus may be generated in accordance with the descriptions in reference to FIGS. 4 through 6B where IPA vapor and DIW are inputted into the region between the wafer 108 and the proximity heads 106*a* and 106*b*. At substantially the same time the IPA and DIW is inputted, a vacuum may be applied in close proximity to the wafer surface to output the IPA vapor, the DIW, and the fluids that may be on a wafer surface. It should be appreciated that although IPA is utilized in the exemplary embodiment, any other suitable type of vapor may be utilized such as any suitable alcohol vapor, organic compounds, hexanol, ethyl glycol, etc. that may be miscible with water. These fluids may also be known as surface tension reducing fluids. The surface tension reducing fluids act to increase the surface tension gradient between the two surfaces (i.e., the proximity head and the surface of the wafer).

The portion of the DIW that is in the region between the proximity head and the wafer is the dynamic liquid meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In another exemplary embodiment, the proximity heads 106*a* and 106*b* may be moved in a manner so all parts of the wafer 108 are processed without the wafer 108 being rotated. In such an embodiment, the proximity head carrier assembly 104 may be configured to enable movement of the either one or both of the proximity heads 106*a* and 106*b* to close proximity of any suitable region of the wafer 108. In one embodiment, of the proximity heads are smaller in length than a radius of the wafer, the proximity heads may be configured to move in a spiral manner from the center to the edge of the wafer 108 or vice versa. In an embodiment where the proximity heads are larger in length than a radius of the wafer, the proximity heads 106*a* and 106*b* may be moved over the entire surface of the wafer in one rotation. In another embodiment, the proximity heads 106*a* and 106*b* may be configured to move in a linear fashion back and forth across the wafer 108 so all parts of the wafer surfaces 108*a* and/or 108*b* may be processed. Countless different configurations of the system 100 may be utilized in order to obtain an optimization of the wafer processing operation.

Figure 3:
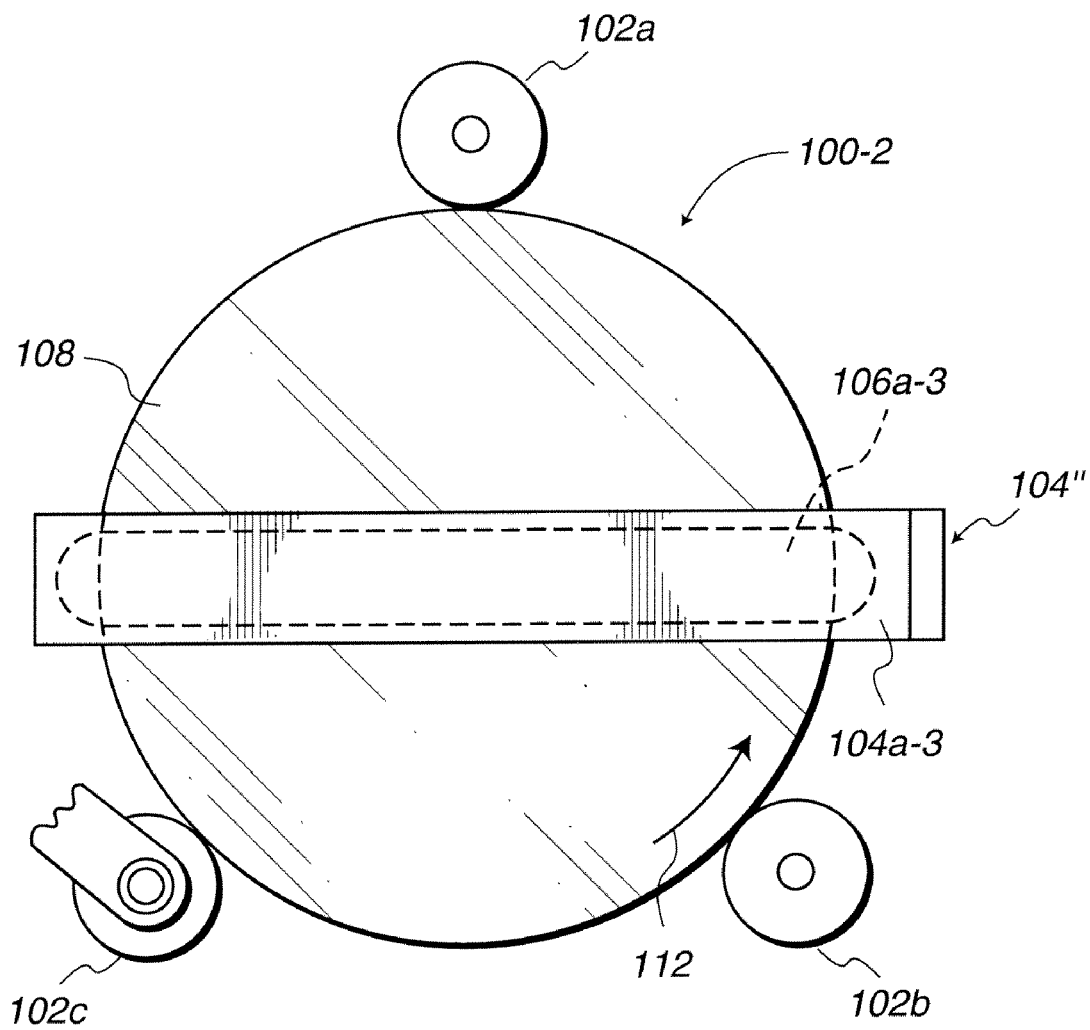
FIG. 3 shows a top view of a semiconductor wafer processing system with a proximity head in a horizontal configuration that extends across a diameter of the substrate, in accordance with one embodiment of the present invention
Figure 4:
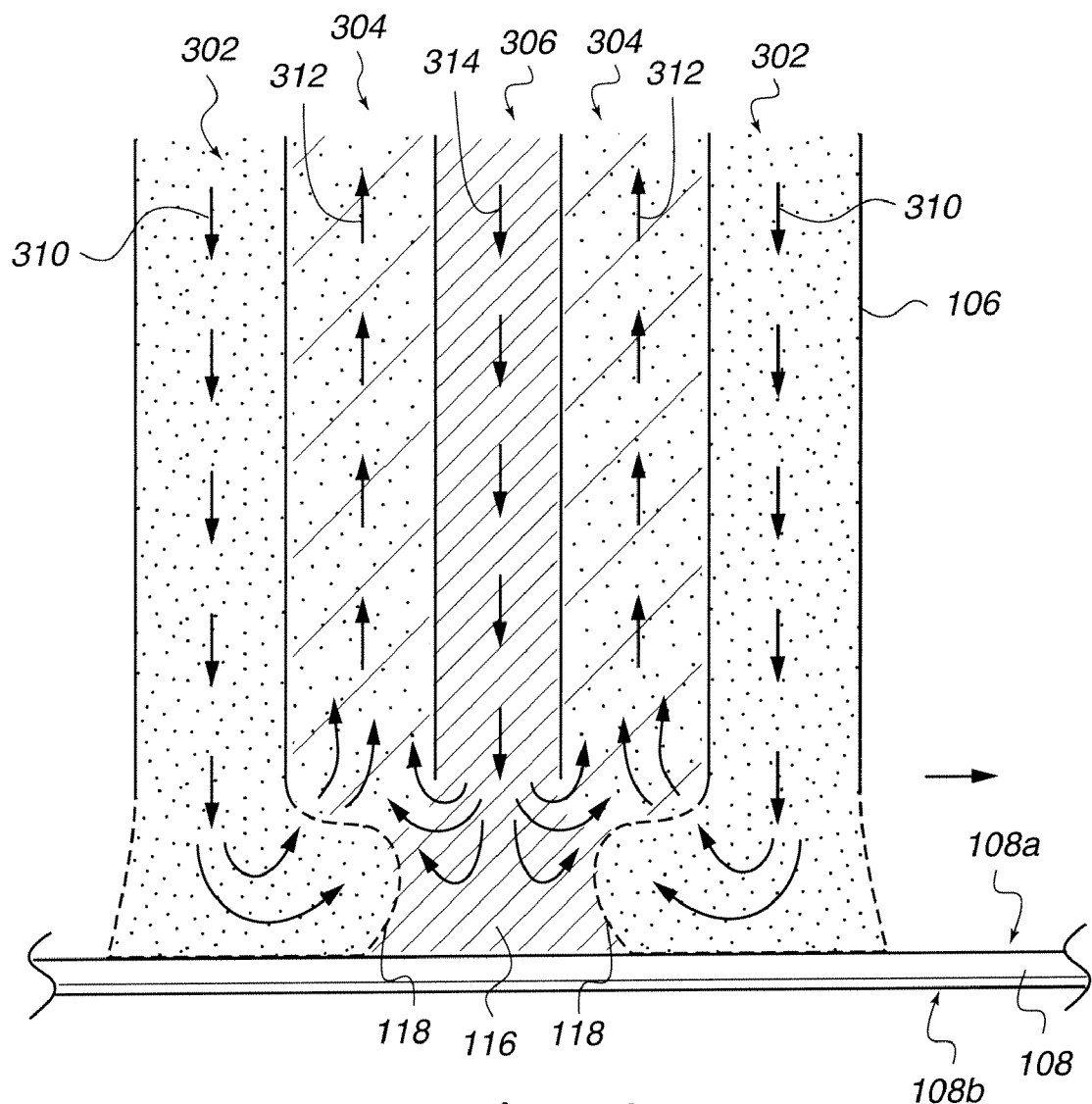
FIG. 4 is an embodiment of an exemplary process that may be conducted by a proximity head, in accordance with one embodiment of the present invention.

FIG. 3 shows a top view of a semiconductor wafer processing system 100-2 with a proximity head 106*a*-3 in a horizontal configuration that extends across a diameter of the wafer 108, in accordance with one embodiment of the present invention. In this embodiment, the proximity head 106*a*-3 is held by an upper arm 104*a*-3 that extends across a diameter of the wafer 108. The proximity head 106*a*-3 may be moved into a processing position by a vertical movement of the upper arm 104*a*-3 so the proximity head 106*a*-3 can be in a position that is in close proximity to the wafer 108. Once the proximity head 106a-3 is in close proximity to the wafer 108, the wafer processing operation of a top surface of the wafer 108 can take place FIG. 4 is an embodiment of an exemplary process that may be conducted by a proximity head 106a, in accordance with one embodiment of the present invention. Although FIG. 4 shows a surface 108a being processed, it should be appreciated that the process may be accomplished in substantially the same way for the bottom surface 108b of the substrate 108. While FIG. 4 illustrates a substrate drying process, many other fabrication processes (e.g., etching, rinsing, cleaning, etc.) may also be applied to the substrate surface in a similar manner. In one embodiment, a source inlet 302 may be utilized to apply isopropyl alcohol (IPA) vapor toward a top surface 108a of the substrate 108, and a source inlet 306 may be utilized to apply deionized water (DIW) toward the top surface 108a. In addition, a source outlet 304 may be utilized to apply vacuum to a region in close proximity to the surface 108a to remove fluid or vapor that may located on or near the top surface 108a.

It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is inputted through use of a $N_2$ carrier gas. Moreover, although DIW is utilized herein, any other suitable fluid may be utilized that may enable or enhance the substrate processing such as, for example, water purified in other ways, cleaning fluids, and other processing fluids and chemistries. In one embodiment, an IPA inflow 310 is provided through the source inlet 302, a vacuum 312 may be applied through the source outlet 304 and DIW inflow 314 may be provided through the source inlet 306. Therefore, an embodiment of the IPA-vacuum-DIW orientation as described above in reference to FIG. 2 is utilized. Consequently, if a fluid film resides on the substrate 108, a first fluid pressure may be applied to the substrate surface by the IPA inflow 310, a second fluid pressure may be applied to the substrate surface by the DIW inflow 314, and a third fluid pressure may be applied by the vacuum 312 to remove the DIW, IPA and the fluid film on the substrate surface.

Therefore, in one embodiment, as the DIW inflow 314 and the IPA inflow 310 is applied toward a surface, any fluid on the surface is intermixed with the DIW inflow 314. At this time, the DIW inflow 314 that is applied toward the surface encounters the IPA inflow 310. The IPA forms an interface 118 (also known as an IPA/DIW interface 118) with the DIW inflow 314 and along with the vacuum 312 assists in the removal of the DIW inflow 314 along with any other fluid from the surface 108a. In one embodiment, the IPA/DIW interface 118 reduces the surface of tension of the DIW. In operation, the DIW is applied toward the surface 108a and almost immediately removed along with fluid on the substrate surface by the vacuum applied by the source outlet 304. The DIW that is applied toward the surface 108a and for a moment resides in the region between a proximity head and the substrate surface along with any fluid on the substrate surface forms a dynamic liquid meniscus 116 where the borders of the meniscus 116 are the IPA/DIW interfaces 118. Therefore, the meniscus 116 is a constant flow of fluid being applied toward the surface 108a and being removed at substantially the same time with any additional fluid that may previously be present on the surface 108a. The nearly immediate removal of the DIW from the surface 108a prevents the formation of fluid droplets on the region of the surface that is being dried thereby reducing the possibility of contamination drying on the surface 108a. The pressure (which is caused by the flow rate of the IPA) of the downward injection of IPA can also help contain the meniscus 116.

The flow rate of the $N_2$ carrier gas for the IPA assists in causing a shift or a push of fluid flow out of the region between the proximity head and the surface 108a and into the source outlets 304 through which the fluids may be output from the proximity head. Therefore, as the IPA and the DIW is pulled into the source outlets 304, the boundary making up the IPA/DIW interface 118 is not a continuous boundary because gas (e.g., air) is being pulled into the source outlets 304 along with the fluids. In one embodiment, as the vacuum from the source outlet 304 pulls the DIW, IPA, and the fluid on the surface 108a, the flow into the source outlet 304 is discontinuous. This flow discontinuity is analogous to fluid and gas being pulled up through a straw when a vacuum is exerted on combination of fluid and gas. Consequently, as the proximity head 106a moves, the dynamic liquid meniscus moves along with the proximity head, and the region previously occupied by the dynamic liquid meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the IPA, DIW, and vacuum as long as the meniscus 116 can be maintained. In one embodiment, the flow rate of the DIW through a set of the source inlets 306 is between about 25 ml per minute to about 3,000 ml per minute. In a preferable embodiment, the flow rate of the DIW through the set of the source inlets 306 is about 400 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304 more flow for larger head.

In one embodiment, the flow rate of the IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the IPA, DIW, and the vacuum.

Figure 5:
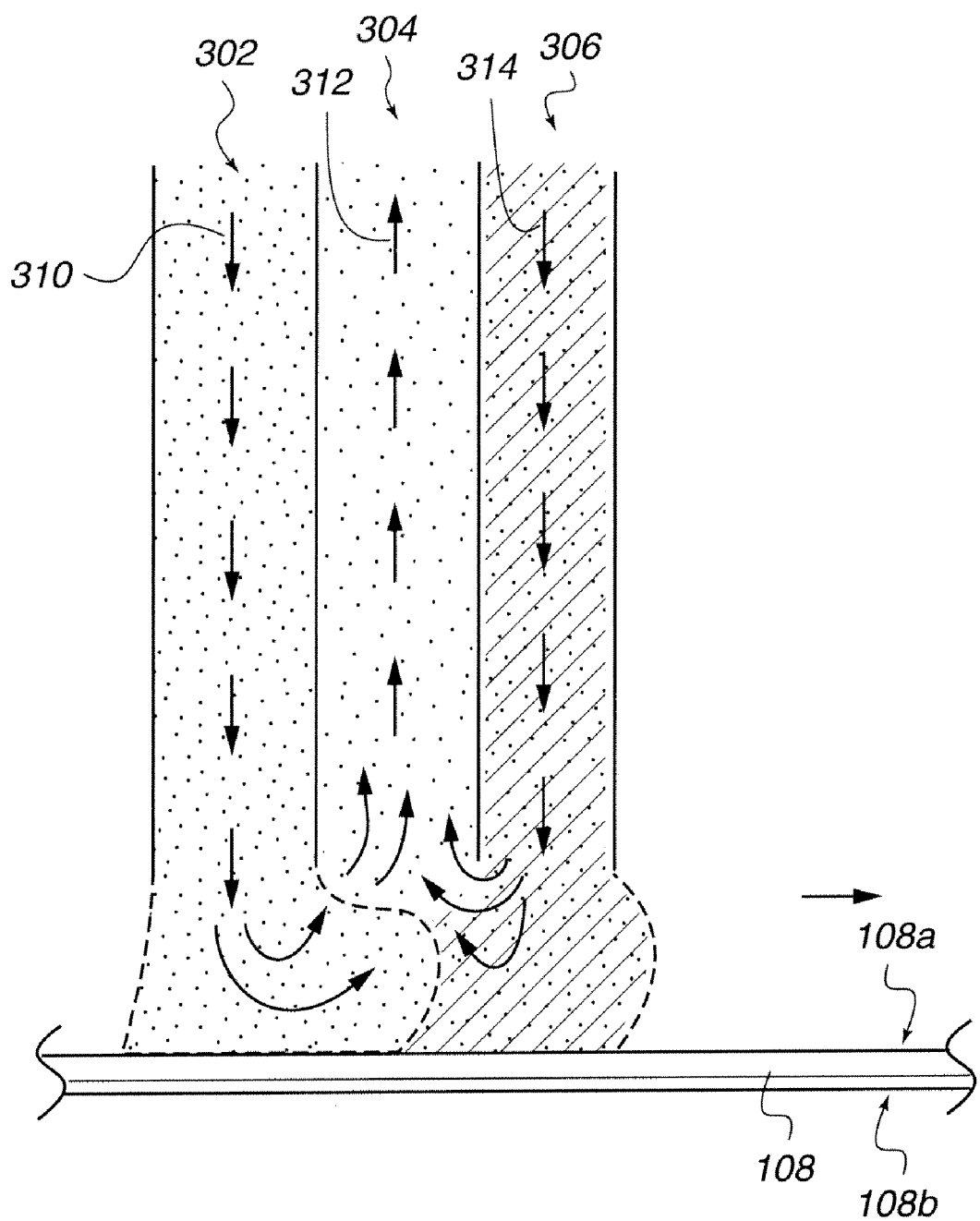
FIG. 5 shows another process using another source inlet/outlet orientation that may be conducted by a proximity head, in accordance with one embodiment of the present invention.
Figure 6:
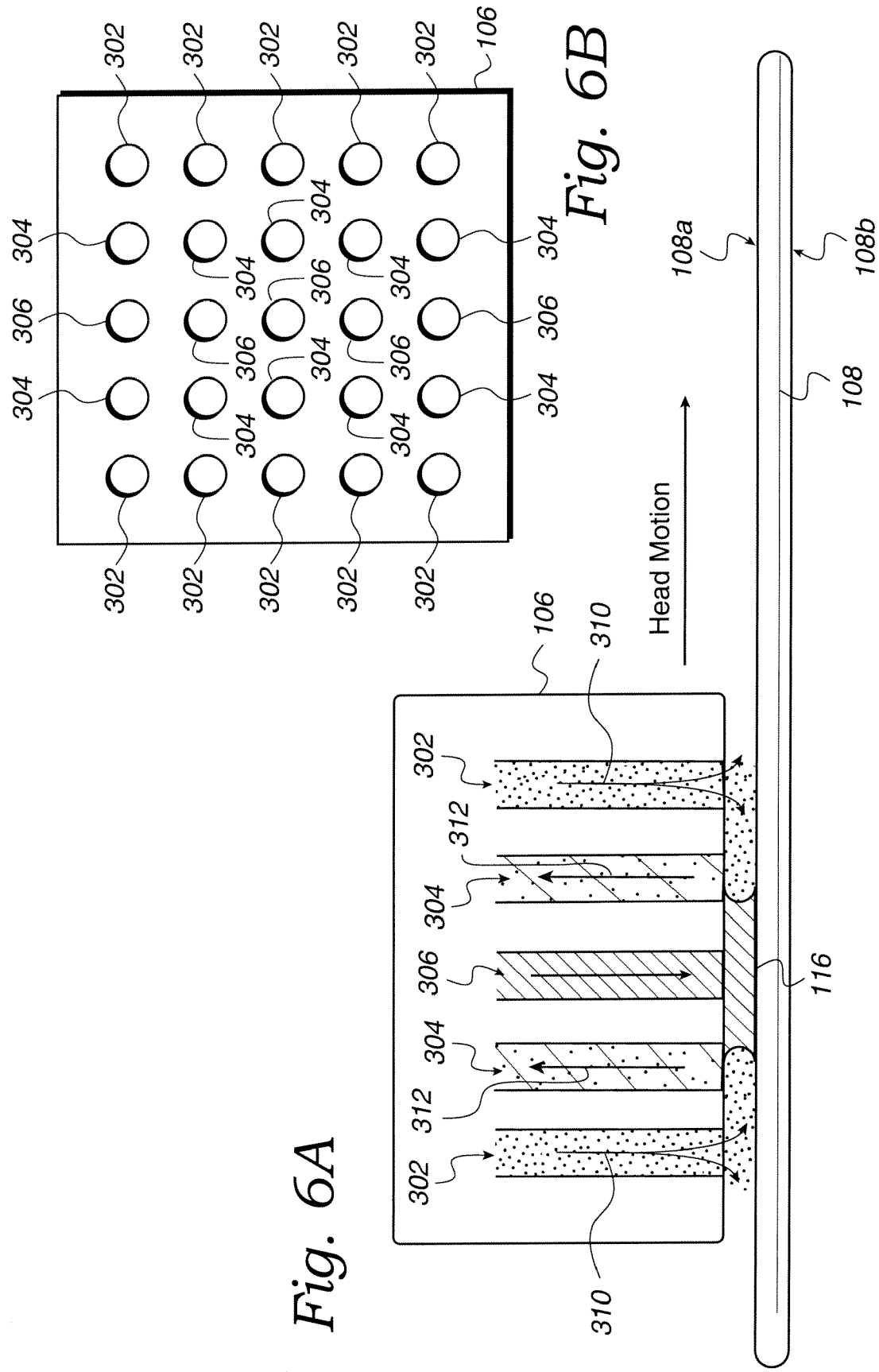
FIG. 6A illustrates a proximity head performing an exemplary process, in accordance with one embodiment of the present invention.
FIG. 6B shows a top view of a portion of a proximity head, in accordance with one embodiment of the present invention.

FIG. 5 shows another process using another source inlet/outlet orientation that may be conducted by a proximity head 106a, in accordance with one embodiment of the present invention. In this embodiment, the proximity head 106a may be moved over the top surface 108a of the substrate 108 so the dynamic liquid meniscus 116 may be moved along the surface 108a in direction 502. The dynamic liquid meniscus applies fluid to the substrate surface and removes fluid from the substrate surface thereby processing (e.g., cleaning, etching, rinsing, etc.) and drying the surface 108a simultaneously. In this embodiment, the source inlet 306 applies a DIW flow 314 toward the surface 108a, the source inlet 302 applies IPA flow 310 toward the surface 108a, and the source outlet 312 removes fluid from the surface 108a.

It should be appreciated that in this embodiment, as well as other embodiments of the proximity head 106a described herein, additional numbers and types of source inlets and source outlets may be used in conjunction with the orientation of the source inlets 302 and 306 and the source outlets 304 shown in FIG. 5. In addition, in this embodiment as well as other proximity head embodiments, by controlling the amount of flow of fluids onto the substrate surface 108a and by controlling the vacuum applied, the meniscus may be managed and controlled in any suitable manner. For example, in one embodiment, by increasing the DIW flow 314 and/or decreasing the vacuum 312, the outflow through the source outlet 304 may be nearly all DIW and the fluids being removed from the substrate surface 108a. In another embodiment, by decreasing the DIW flow 314 and/or increasing the vacuum 312, the outflow through the source outlet 304 may be substantially a combination of DIW and air as well as fluids being removed from the substrate surface 108a.

FIG. 6A illustrates a proximity head 106 performing an exemplary process, in accordance with one embodiment of the present invention. The proximity head 106, in one embodiment, moves while in close proximity to the top surface 108a of the substrate 108 to conduct a cleaning and/or drying operation. It should be appreciated that the proximity head 106 may also be utilized to process (e.g., electroplate, etch, clean, dry, etc.) the bottom surface 108b of the substrate 108. In one embodiment, the substrate 108 is rotating relative to the proximity head 106 so that the proximity head may be moved in a linear fashion along the head motion while fluid is removed from the top surface 108a. By applying the IPA 310 through the source inlet 302, the vacuum 312 through source outlet 304, and the deionized water 314 through the source inlet 306, the meniscus 116 as discussed in reference to FIGS. 4 and 5 above may be generated.

FIG. 6B shows a top view of a portion of a proximity head 106, in accordance with one embodiment of the present invention. As shown from left to right are a set of the source inlet 302, a set of the source outlet 304, a set of the source inlet 306, a set of the source outlet 304, and a set of the source inlet 302. Therefore, as $N_2$/IPA and DIW are input into the region between the proximity head 106 and the surface 108a, the vacuum removes the $N_2$/IPA and the DIW along with any fluid film and other contaminants (e.g., particles, residues, etc.) that may reside on the surface 108a. The source inlets 302, the source inlets 306, and the source outlets 304 described herein may also be any suitable type of geometry such as for example, circular opening, square opening, etc. In one embodiment, the source inlets 302 and 306 and the source outlets 304 have circular openings.

Figure 7:
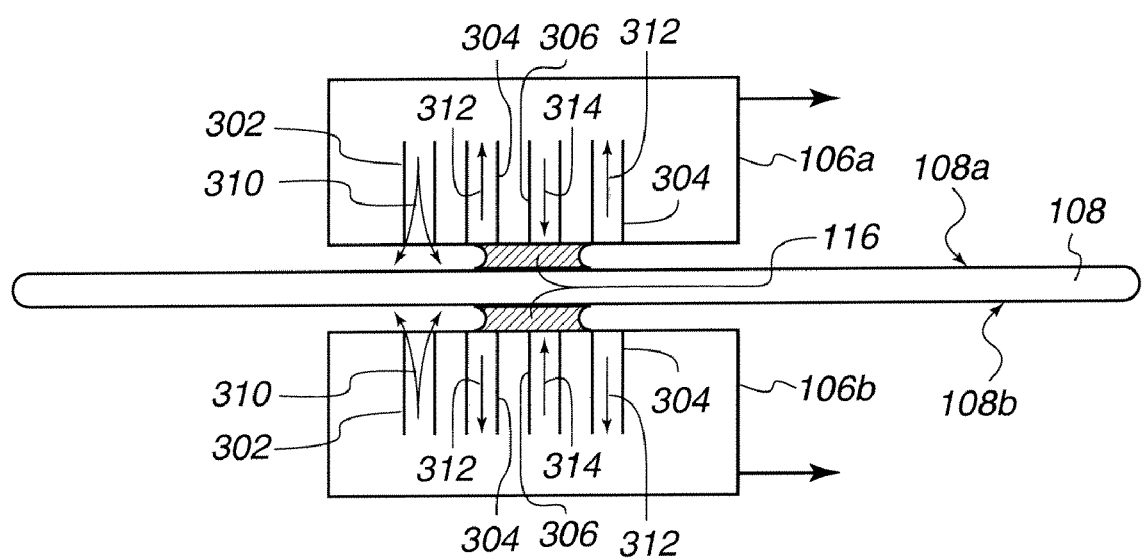
FIG. 7 illustrates a side view of the proximity heads for use in a dual substrate surface processing system, in accordance with one embodiment of the present invention.

FIG. 7 illustrates a side view of the proximity heads 106a and 106b for use in a dual substrate surface processing system, in accordance with one embodiment of the present invention. In this embodiment, by usage of source inlets 302 and 306 to input $N_2$/IPA and DIW (or other processing fluids) respectively along with the source outlet 304 to provide a vacuum, the dynamic liquid meniscus 116 may be generated. In addition, on the side of the source inlet 306 opposite that of the source inlet 302, there may be a source outlet 304 to remove DIW and to keep the meniscus 116 intact. As discussed above, in one embodiment, the source inlets 302 and 306 may be utilized for $N_2$/IPA inflow 310 and DIW inflow 314 respectively while the source outlet 304 may be utilized to apply vacuum 312. It should be appreciated that any suitable configuration of source inlets 302, source outlets 304 and source inlets 306 may be utilized. For example, the proximity heads 106 and 106b may have a configuration of source inlets and source outlets like the configuration described above in reference to FIGS. 6A and 6B. In addition, in yet more embodiments, the proximity heads 106a and 106b may be of a configuration as shown below in reference to FIGS. 8A through 10. Any suitable surface coming into contact with the meniscus 116 may be processed and dried by the movement of the dynamic liquid meniscus 116 into and away from the surface 108a.

As shown in FIG. 7, the proximity head 106 processes the top surface 108a of the substrate 108, and the proximity head 106b processes the bottom surface of 108b of the substrate 108. By the inputting of the $N_2$/IPA and the DIW by the source inlets 302 and 306 respectively, and by use of the vacuum from the source outlet 304, the meniscus 116 may be formed between the proximity head 106 and the substrate 108 and between the proximity head 106b and the substrate 108. The proximity heads 106 and 106b, and therefore the dynamic liquid meniscus 116, may be moved over the wet areas of the substrate surface in a manner so the entire substrate 108 can be processed (e.g., cleaned, dried).

Figure 8A:
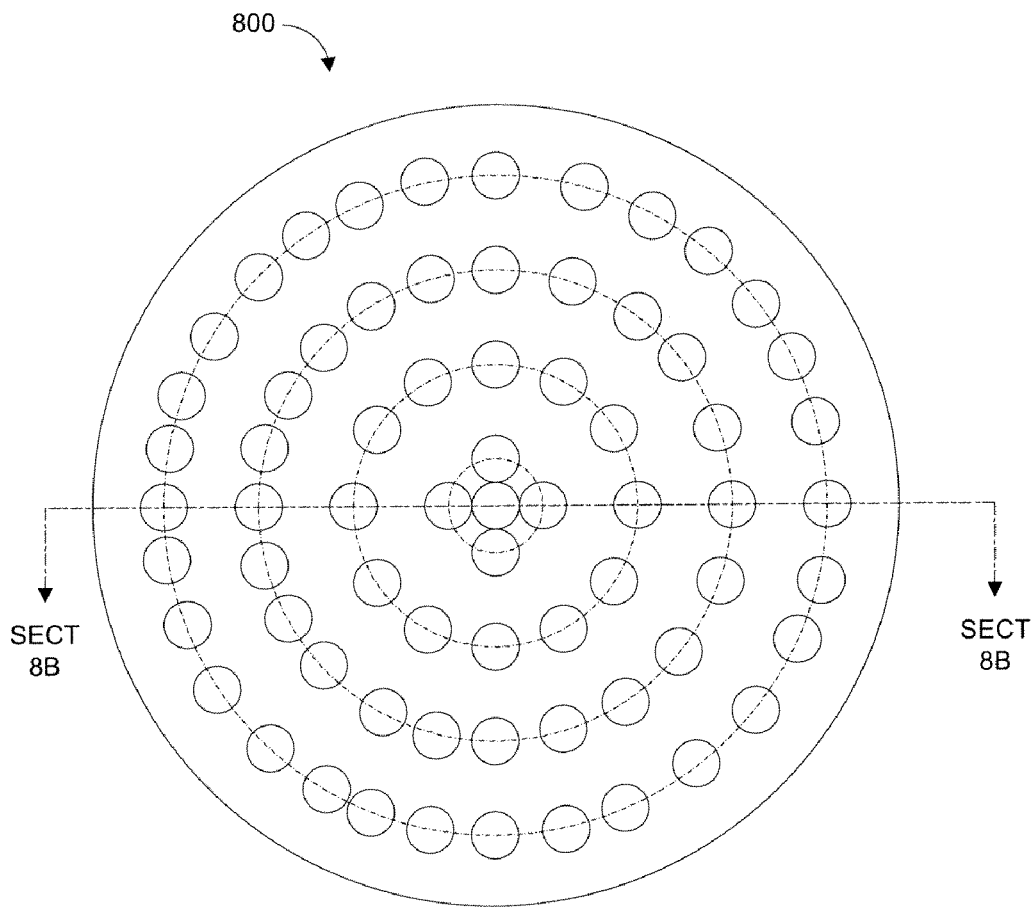
FIG. 8A illustrates an exemplary proximity head, in accordance with one embodiment of the present invention.
Figure 8B:
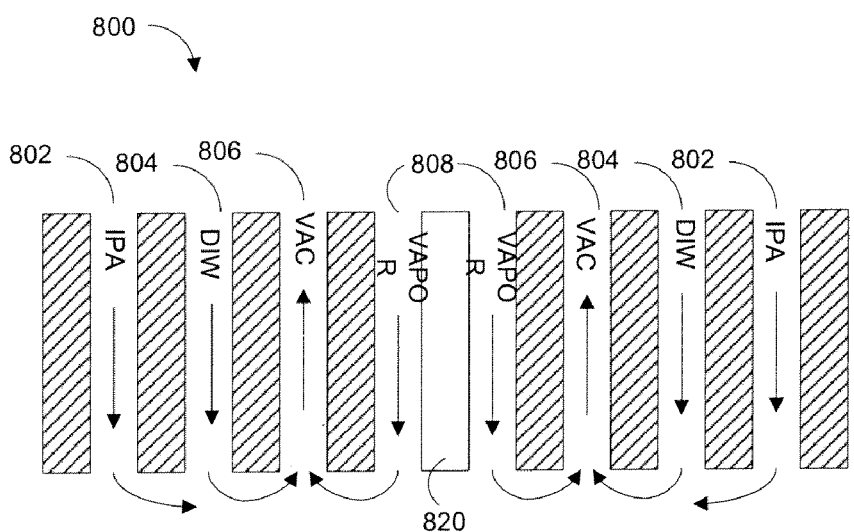
FIG. 8B illustrates a sectional view of the proximity head, in accordance with one embodiment of the present invention.

FIG. 8A illustrates an exemplary proximity head 800, in accordance with one embodiment of the present invention. FIG. 8B illustrates a sectional view of the proximity head 800, in accordance with one embodiment of the present invention. The proximity head 800 includes multiple process chemistry inlets 804, multiple IPA inlets 802, multiple IPA vapor inlets 808 and multiple vacuum outlets 806. The various inlets 802, 804, 806 and outlets 808 are arranged around a center portion 820. The center portion 820 can be a sensor or an opening in the proximity head 800.

The sensor can be any type of sensor that may be useful within the proximity head 800. By way of example, an in-situ metrology sensor can monitor an etch process to determine if the material desired to be etched away has been fully removed or partially removed according to the desired result. The sensor can include one or more of the following exemplary types of sensors: eddy current sensor (e.g., for measuring metal and other compatible materials), scatterometry (e.g., for particle or topography measurements), optical interferometry or reflectometery (e.g., for measuring film thickness) and any other of the various endpoint detection methods that are known to one skilled in the art.

Figure 9A:
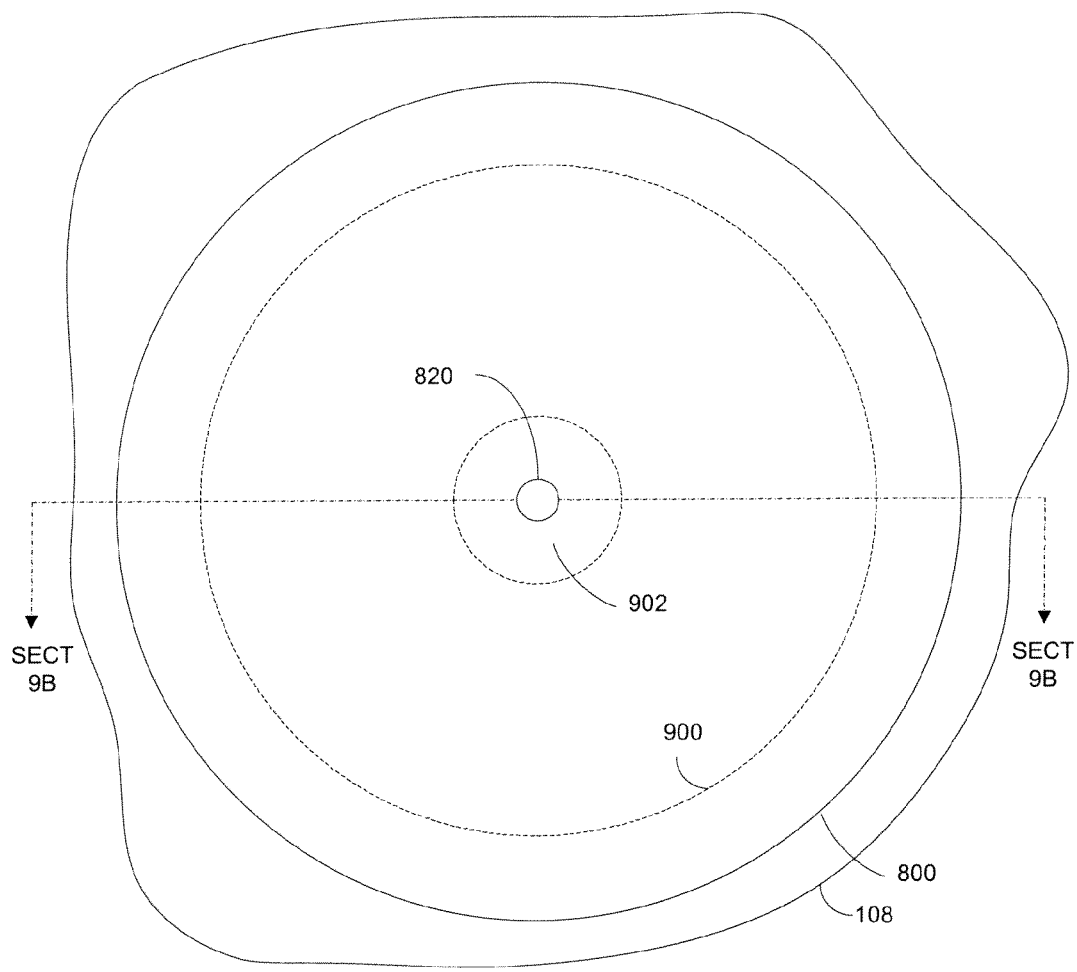
FIG. 9A shows a top view of an exemplary annular meniscus formed by the proximity head, in accordance with one embodiment of the present invention.
Figure 9B:
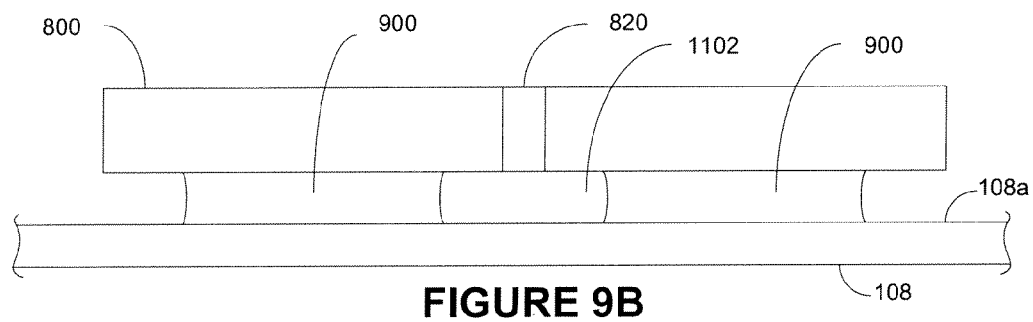
FIG. 9B shows a sectional view of the annular meniscus formed by the proximity head, in accordance with one embodiment of the present invention.

FIG. 9A shows a top view of an exemplary annular meniscus 900 formed by the proximity head 800, in accordance with one embodiment of the present invention. FIG. 9B shows a sectional view of the annular meniscus 900 formed by the proximity head 800, in accordance with one embodiment of the present invention. The annular meniscus 900 includes a dry central region 902 where the liquid meniscus 900 is removed so that the center portion 820 has no intervening processing chemistry from the meniscus 900 between the central region 902 and the surface of the substrate 108.

By way of example, a sensor located in the center portion 820 can be a fiber optic sensor that can be used for laser or broadband optical interferometry from the dry central region 902. In one embodiment, the proximity head 800 can apply an etch process to the surface 108a. To be effective and timely, an etch process requires a higher concentration of etch chemistry than might typically be used in a multiple substrate batch process to be applied to the film to be removed from the surface 108a. A precise in-situ film measurement can be accomplished by the optical interferometry in the dry central region 902 without the interference typically caused by a thin liquid film or even by the meniscus 900. Rotating the substrate 108 and scanning the proximity head 800, and therefore the sensor 820, across the surface 108a can provide an in-situ scan of the entire surface of the substrate, as the proximity head processes the surface 108a.

The sensor can also provide real time feedback of the etch process. Providing the real time feedback to a control system that controls the etch process will provide a closed control loop of the etch process. The closed loop control of the etch process can allow the control system to interactively adjust the etch process in real time. Any of the multiple etch process variables can be adjusted including head position, concentrations, resident time, flow rates, pressures, chemistry and other process variables. In this manner more precise process control is provided. A more precise process control allows ever more concentrated etch chemistries to be used, which in turn reduces the process time of the substrate to a minimum.

The in-situ, real time control of the process can also enable a variable process to be applied to the surface 108a of the substrate 108 such as to correct for a non-uniformity during the processing of the surface 108a. By way of example, if in an etch process, the sensor can detect a thinner film in a first region of the surface 108a and a thicker film in a second region. The etch process recipe can be dynamically adjusted (e.g., etch chemistry concentration, residence time, etc.) for the detected film thickness as the proximity head 800 scans across the surface 108a. As a result, the non-uniform film thickness can be dynamically corrected in-situ as the etch process is applied to the surface 108a thereby substantially eliminating the need for reprocessing the surface 108a to correct for non-uniformities.

Part 2: Substrate Dicing

Figure 10A:
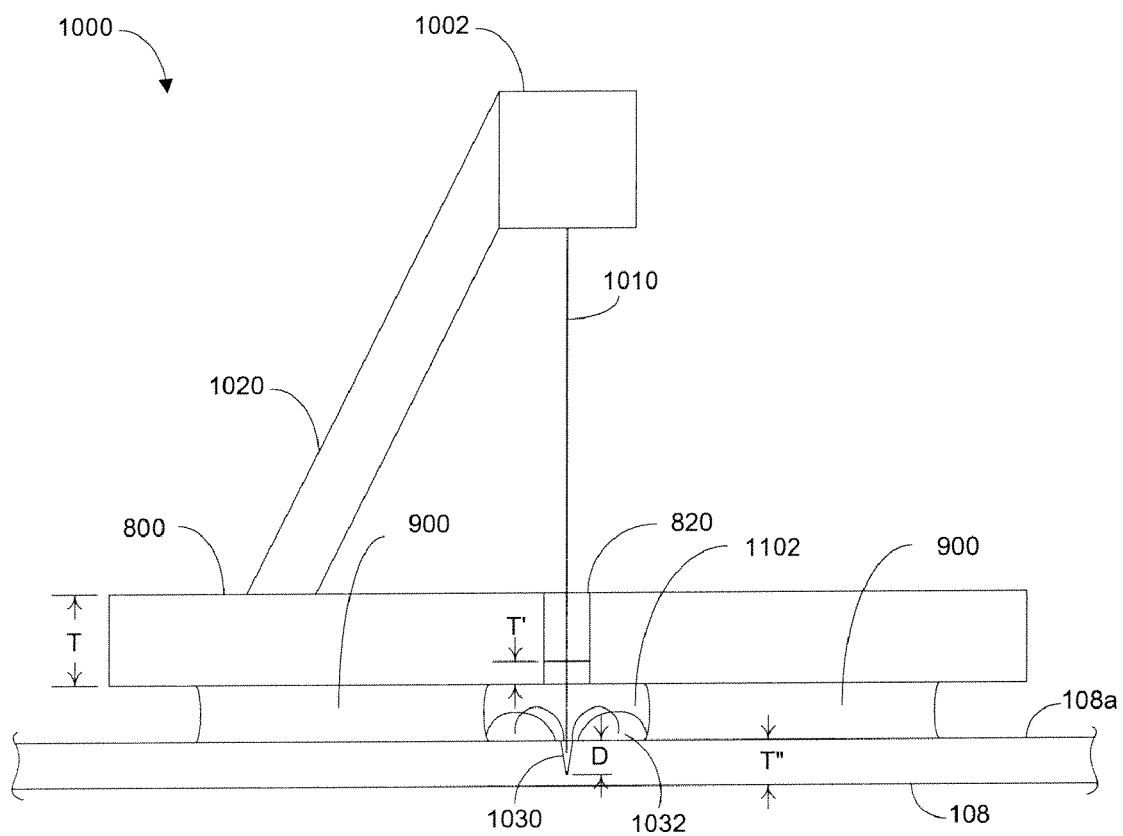
FIG. 10A shows a side view of a substrate dicing system, in accordance with one embodiment of the present invention.
Figure 10B:
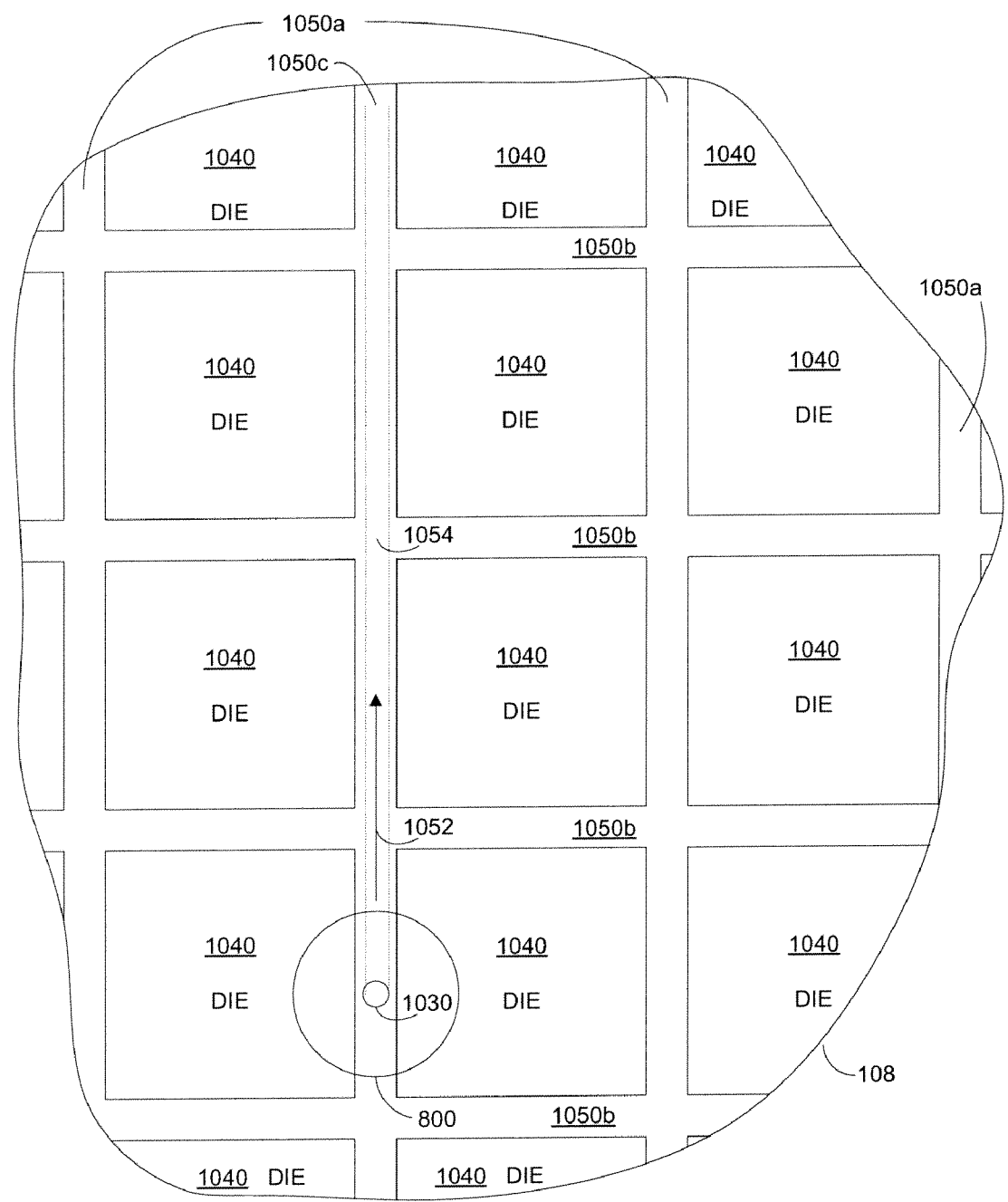
FIG. 10B shows a top view of the substrate dicing system, in accordance with one embodiment of the present invention.

FIG. 10A shows a side view of a substrate dicing system 1000, in accordance with one embodiment of the present invention. FIG. 10B shows a top view of the substrate dicing system 1000, in accordance with one embodiment of the present invention. The substrate dicing system 1000 includes a proximity head 800 as described above in FIGS. 8A through 9B. The proximity head 800 can support either of an annular dynamic liquid meniscus 900 (e.g., shown in FIGS. 9A through 10) or a dynamic liquid meniscus that is not annular, e.g., does not include the central dry region 902.

The substrate dicing system 1000 also includes a laser source 1002 that can emit a laser 1010. The center portion 820 of the proximity head 800 can be a laser transparent "window" that is substantially transparent to the beam of laser 1010. By way of example, the laser transparent window can be glass or quartz or any other material that is substantially transparent to the laser 1010. In one embodiment, if the window is a red glass but the red glass is substantially transparent to the wavelength of light in the laser 1010. As used herein, the window is substantially transparent to the laser 1010 is the laser is not substantially diffracted or absorbed by the material or materials that form the window in the center portion 820. The window can also be substantially thinner than the proximity head 800. By way of example, if the proximity head 800 has a thickness T of about 20.0 mm, the window can have a thickness of about 1.0 mm or less.

As the laser 1010 contacts the surface 108a of the substrate 108, a portion of the substrate is cut away to form a groove or cut-away portion 1030 into the surface 108a. As the groove 1030 is formed, the laser can produce particles.

The laser source 1002 can be a water-jet laser source that emits a laser that is encased within a stream of water, such as described above in the background section. The center portion 820 of the proximity head 800 can be an opening through the proximity head so that the water-jet laser 1010 can pass through the proximity head to the surface of the substrate 108a.

Optionally, the laser source 1002 can be mechanically linked to the proximity head 800 such as by optional mechanical link 1020. The mechanical link 1020 maintains the alignment of the laser source 1002 and the beam of laser 1010 with the center portion 820 of the proximity head 800. Alternatively, the laser source 1002 can be controlled (e.g., moved) independent of the proximity head 800 so as to align the laser source 1002 and the beam of laser 1010 with the center portion 820.

In an embodiment where the laser source 1002 includes the water-jet laser source (e.g., from Synova SA of Ecublens, Switzerland), the proximity head 800 can collect the water 1032 from the water jet and remove the water as part of the processing fluid that forms the meniscus 900. As described above, the dynamic liquid meniscus 900 is formed by the fluid(s) being supplied to the meniscus 900 and being drawn away under a vacuum. As the fluid is drawn away from the meniscus 900 under a vacuum, the fluids can combine with the water 1032 from the water jet laser and entrain and carry away any particles generated by the laser 1010. Further, the dynamic liquid meniscus 900 provides a containment of the water 1032 and any particles generated by the laser 1010. In this manner, the potential impact (e.g., particle contamination and fluid contamination) to the surface 108a of the substrate 108 is substantially contained and limited.

Referring now to FIG. 10B, the proximity head 800 and the laser source 1002. The substrate 108 includes multiple dies 1040 that are separated by scribe channels 1050a-1050c. The proximity head 800, scribe channels 1050a-1050c and the dies 1040 are not drawn to typical scales envisioned. Typically, the scribe channels 1050a-1050c are minimized so as to maximize the use of the substrate 108. The proximity head 800 and the laser source 1002 can be moved along the scribe channels 1050a and 1050b so as to cut grooves into the scribe channels. By way of example, the proximity head 800 and the laser source 1002 can be moved in direction 1052 along scribe channel 1050c and thereby cutting away a portion 1054 of the surface 108a.

Figure 11:
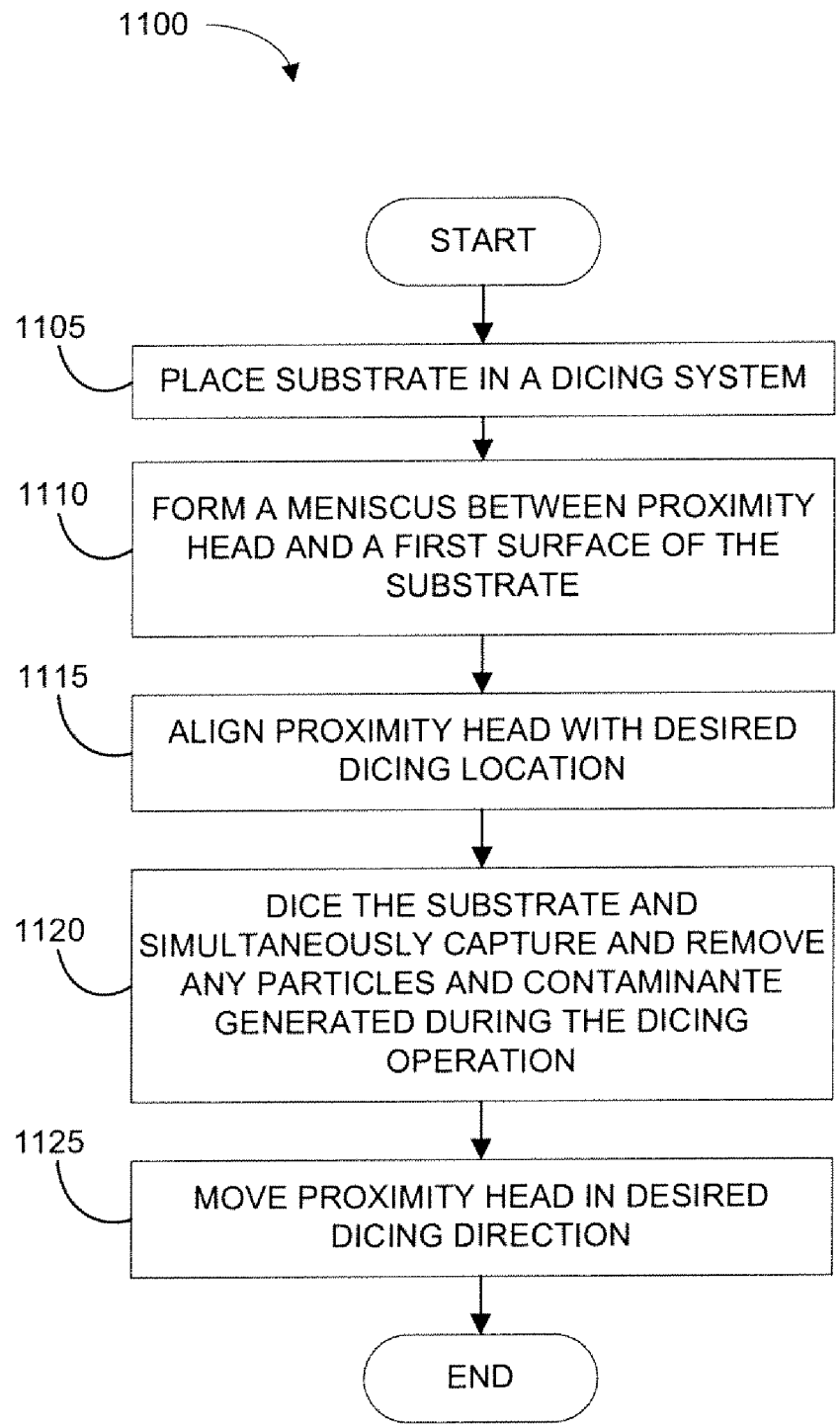
FIG. 11 is a flowchart of the method operations for dicing a substrate, in accordance with one embodiment of the present invention.

As described above, the dynamic liquid meniscus 900 can clean, rinse, etch and dry a surface of the substrate in a single pass. By way of example, as the proximity head 800 and the laser 1010 pass across the surface 108a of the substrate 108, the dynamic liquid meniscus 900 can rinse away any particles that were generated and dry the surface of the substrate. FIG. 11 is a flowchart of the method operations 1100 for dicing a substrate, in accordance with one embodiment of the present invention. In an operation 1105, the substrate 108 is placed within the substrate dicing system 1000 such as described above.

In an operation 1110, the proximity head 800 forms a dynamic liquid meniscus 900 between the surface 108a and the proximity head 800. The dynamic liquid meniscus 900 can be formed using any desired fluids and/or chemistry. By way of example, in one application, the particles produced in a dicing process may by more likely to adhere to the surface 108a and therefore a cleaning solution may be needed rather than water or DIW. Alternatively, in a second application, a film of water or DIW may be sufficient to carry away the particles produced by the dicing process.

In an operation 1115, the proximity head 800 aligns the central portion 820 with a desired dicing location (e.g., an unused area 1050c between the dies 1040) on the substrate 108.

In an operation 1120, the substrate is diced. By way of example, the laser source 1002 can emit the laser 1010 to begin dicing the substrate 108 in the unused area 1050c. Also in operation 1120, simultaneously with the laser source dicing the substrate 108, any particles and water and other contaminants created in the dicing process are contained within the dynamic liquid meniscus 900. As the fluids within the dynamic liquid meniscus 900 flow out of the meniscus, the particles and water and other contaminants created in the dicing process are carried away from the surface 108a of the substrate 108.

In an operation 1125, the proximity head 800 and laser 1010 moves along the unused area 1050c to cut away a portion 1054 into the top surface 108a of the substrate 108. The depth D that the laser 1010 cuts into the top surface 108a of the substrate 108 is determined by a number of factors including a residence time, a material being cut and/or a wavelength and a power of the laser 1010, to name but a few. By way of example, the time that the laser 1010 is focused on a particular location (i.e., the residence time) can determine the depth of the material removed from the substrate 108. The type of material being removed can also impact the depth the laser 1010 cuts into the substrate 108. By way of example, if the top surface is a photoresist layer that is particularly sensitive to light, then the laser 1010 may cut through the photoresist layer very quickly. However, if the top layer of the substrate 108 is a layer of silicon or silicon oxide, then the same laser may not cut through the silicon or silicon oxide layer as quickly as the photoresist layer. The power (i.e., intensity) and/or wavelength of the laser 1010 can also be selected to determine a cutting rate (i.e., micron/second) that the laser will cut into the substrate 108.

As described above, the depth D that the laser 1010 cuts into the substrate 108 can be selected. In one embodiment, the depth D is less than a thickness T" of the substrate 108 (i.e., the dicing operation is a partial dicing operation). Alternatively, the depth D is at least equal to the thickness T" of the substrate 108 (i.e., the dicing operation is a full dicing operation).

As the proximity head 800 and laser 1010 moves across the surface 108a, the meniscus 900 removes substantially all of the particles generated by the laser, the fluids and moisture from the surface 108a. As a result, the meniscus 900 dries the surface 108a simultaneously with the laser dicing process thereby providing a dry-in dry-out substrate dicing process. The meniscus 900 can capture the any fluids (e.g., the water jet). The captured fluids can be filtered to remove particles or other contaminants and reused, thereby reducing a potentially costly waste stream.

Figure 12:
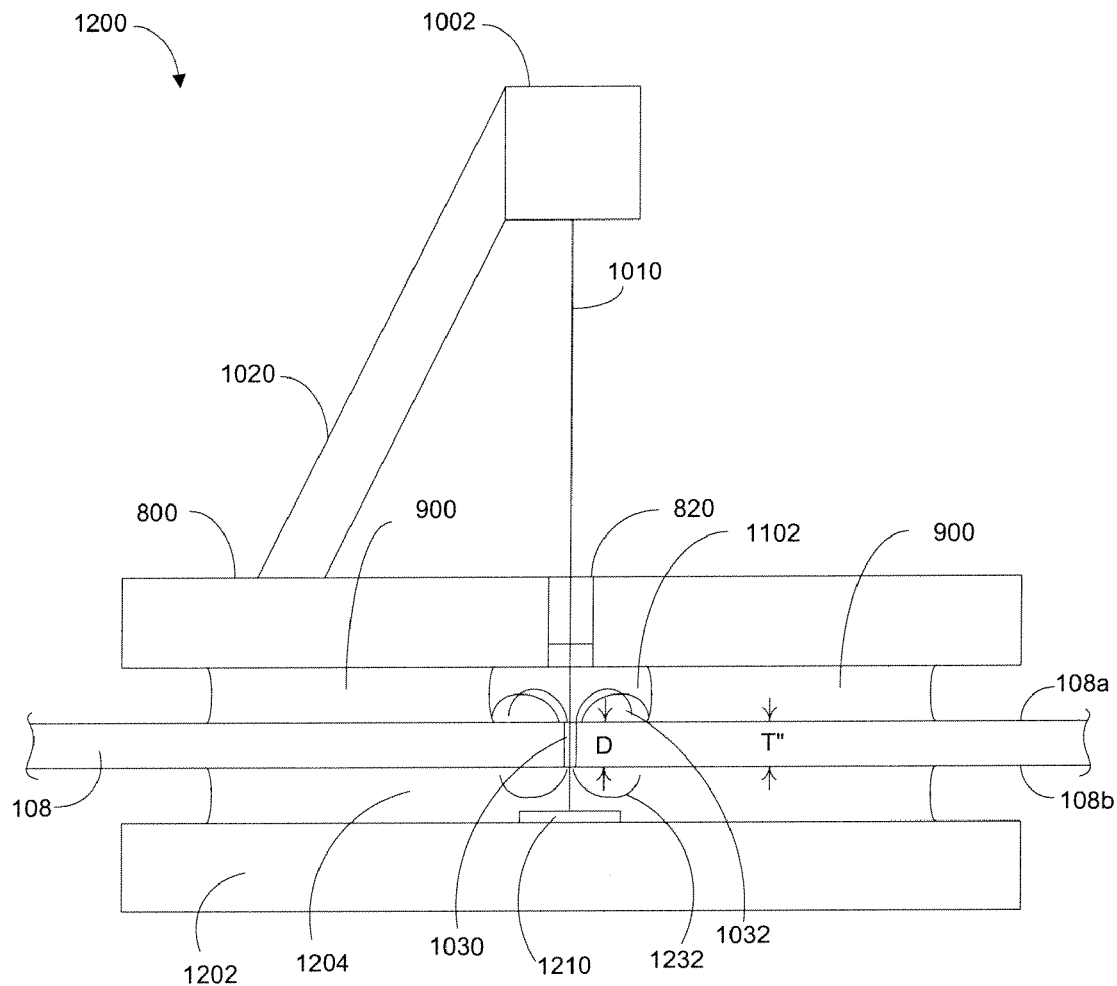
FIG. 12 shows a full dicing system, in accordance with one embodiment of the present invention.

FIG. 12 shows a full dicing system 1200, in accordance with one embodiment of the present invention. As described above, in the full dicing system 1200, the depth D that the laser 1010 cuts into the substrate 108 is equal to or greater than the thickness T" of the substrate 108. The full dicing system 1200 includes a laser-absorbing target 1210 that is opposite to the proximity head 800. A second proximity head 1202 can support the target 1210. The second proximity head 1202 can also support a corresponding dynamic liquid meniscus 1204 between the surface 108b and the second proximity head 1202. The surface 108b is opposite surface 108a of the substrate 108 and the second proximity head 1202. As described above with regard to the dynamic liquid meniscus 900, the corresponding dynamic liquid meniscus 1204 can entrain and carry away any particles formed or released on the opposite surface 108b during the dicing process.

Figure 13:
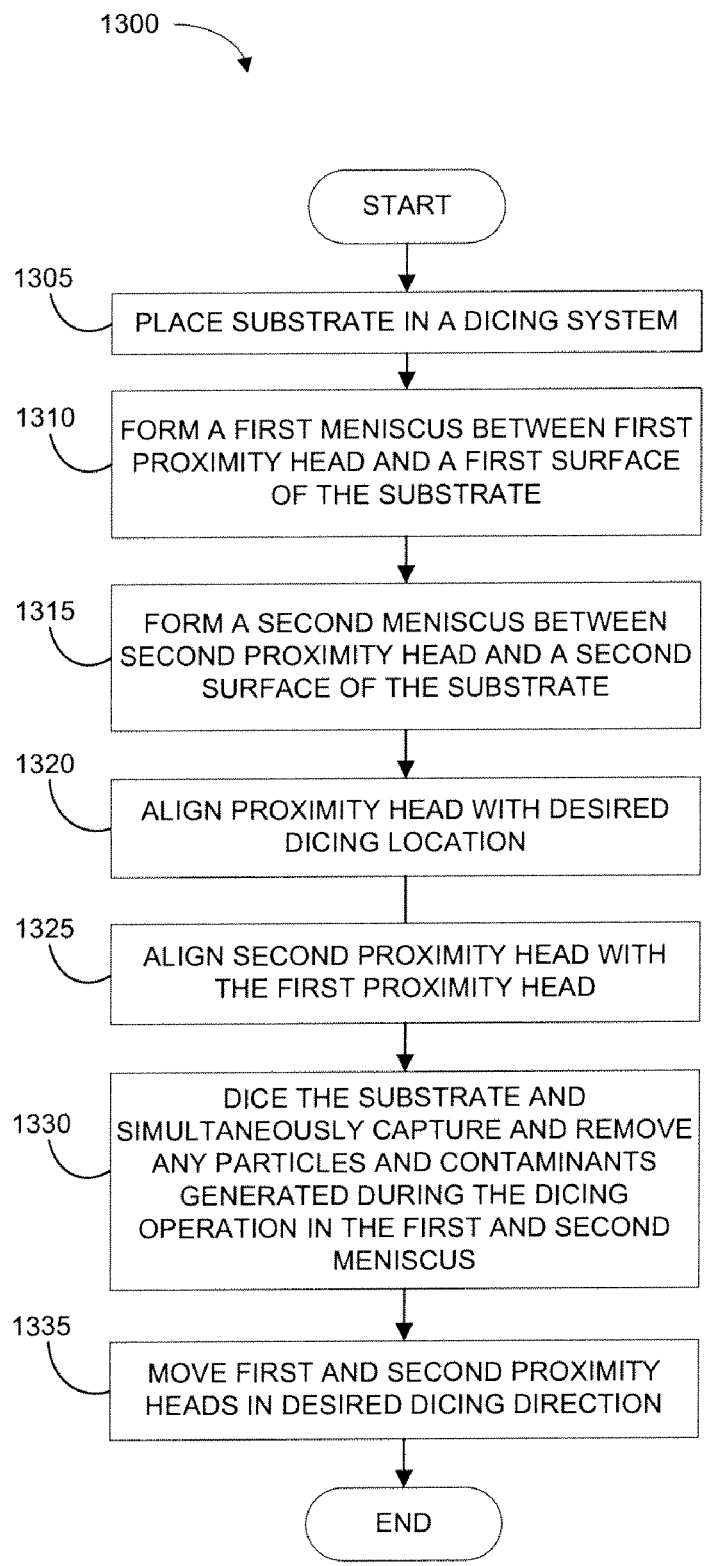
FIG. 13 is a flowchart of the method operations for the operation of the full dicing system, in accordance with one embodiment of the present invention.

FIG. 13 is a flowchart of the method operations 1300 for the operation of the full dicing system 1200, in accordance with one embodiment of the present invention. In an operation 1305, the substrate 108 is placed within the substrate dicing system 1200 such as described above.

In an operation 1310, the first proximity head 800 forms a first dynamic liquid meniscus 900 between the surface 108a and the proximity head 800. In an operation 1315, the second proximity head 1202 forms a second dynamic liquid meniscus 1204 between the surface 108b and the second proximity head 1202.

In an operation 1320, the first proximity head 800 aligns the central portion 820 with a desired dicing location (e.g., an unused area 1050c between the dies 1040) on the substrate 108. In an operation 1325, the second proximity head 1202 aligns with the first proximity head 800. The second proximity head 1202 can also align the target 1210 with the desired dicing location.

In an operation 1330, the substrate is diced. By way of example, the laser source 1002 can emit the laser 1010 to begin dicing the substrate 108 in the unused area 1050c. Also in operation 1330, simultaneously with the laser source dicing the substrate 108, any particles and water and other contaminants created in the dicing process are contained within the dynamic liquid meniscus 900. As the fluids within the dynamic liquid meniscus 900 flow out of the meniscus, the particles and water and other contaminants created in the dicing process are carried away from the surface 108a of the substrate 108. As the laser 1010 cuts fully through the substrate 108, the second meniscus 1204 captures any particles 1232, water and other contaminants created in the dicing process are carried away from the second surface 108b. Also in operation, 1330 as the laser 1010 cuts fully through the substrate 108, the laser can be absorbed by the laser-absorbing target 1210.

In an operation 1335, the first proximity head 800 and laser 1010 move along the unused area 1050c to cut away a portion 1054 into the top surface 108a of the substrate 108. The second proximity head 1202 moves with the first proximity head 800 so as to maintain alignment with the location that the laser 1010 is dicing the substrate 108.

Figure 14:
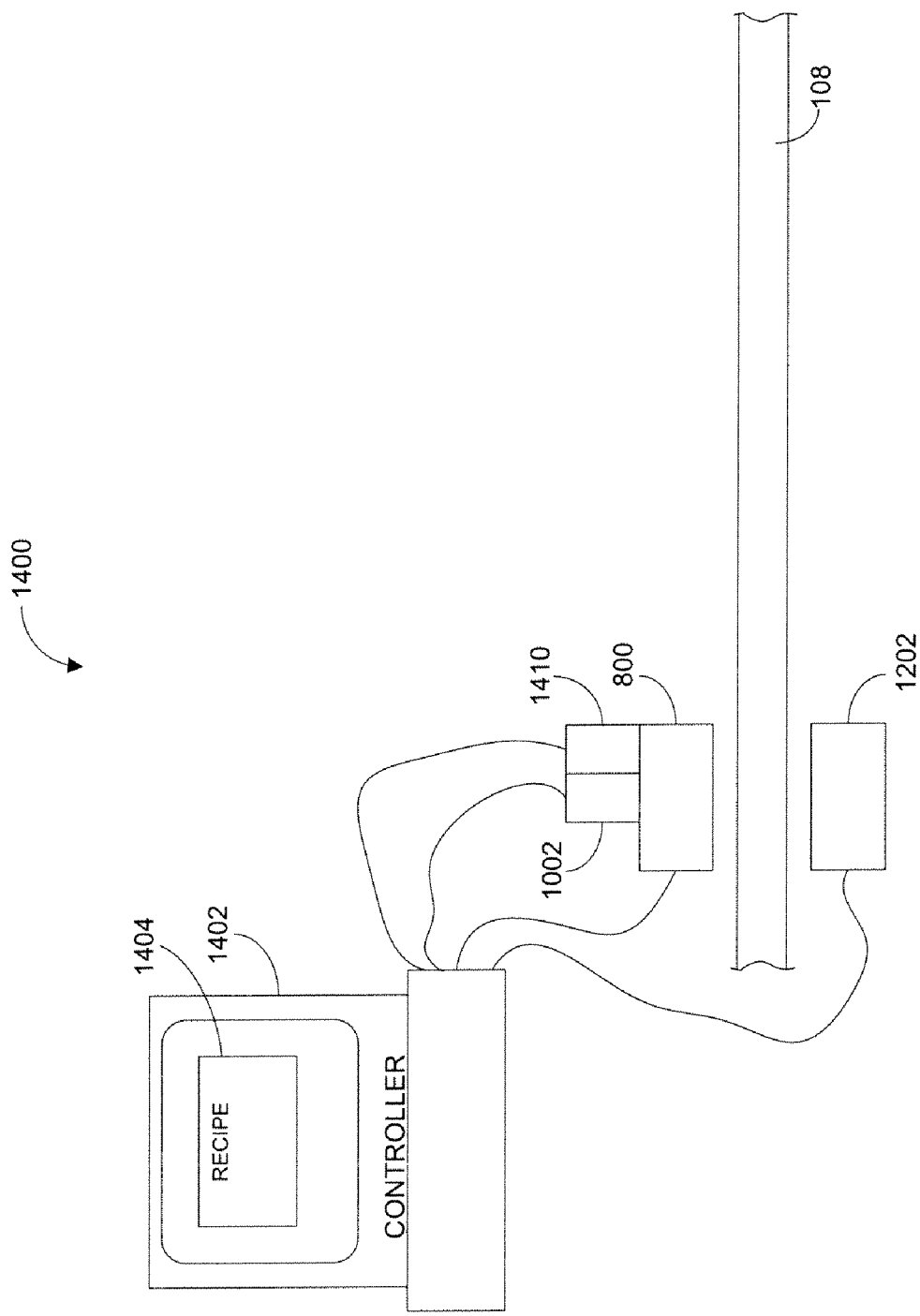
FIG. 14 shows a block diagram of a substrate processing system, in accordance with one embodiment of the present invention.

FIG. 14 shows a block diagram of a substrate processing system 1400, in accordance with one embodiment of the present invention. The system includes a controller 1402 that includes a recipe 1404. The recipe 1404 controls the various parameters and aspects of the processes applied to the substrate 108 by the proximity heads 800 and 1202. By way of example, the recipe determines flowrates of DIW, IPA and IPA vapor and pressures of the vacuum and the precise location of the proximity heads 800 and 1202 and the direction of the proximity heads relative to the substrate 108. The substrate processing system 1400 also includes a laser source 1002 as described above in FIGS. 10A-13. The recipe 1404 also controls the various aspects (e.g., a residence time, a material being cut and/or a wavelength and a power) of the laser 1010 (not shown) that is emitted from the laser source 1002 as described above.

The substrate processing system 1400 can also include a sensor 1410 as described above in reference to FIGS. 8A-9B. Sensor 1410 can monitor and evaluate the processes applied to the substrate 108 by the proximity heads 800 and 1202 and the laser 1010. By way of example, the sensor 1410 can monitor the depth D that the laser 1010 cuts into the substrate 108. In one embodiment, the sensor 1410 can provide feedback to the controller 1402. The controller 1402 can then modify the recipe in response to the feedback from the sensor 1410. The sensor 1410 can be included within the proximity head 800 such as described in FIGS. 8A-9B above. Alternatively, the sensor 1410 can be external to the proximity heads 800 and 1202.

While the above invention has been described in terms of a dicing laser, the proximity head 800 can also be combined with other types of dicing mechanisms such as an abrasive saw or a scoring device to similarly capture and transport any particles and contaminants created during the dicing process. In addition, the proximity head causes the resulting dies to be clean and dry after the dicing process.

While the above invention has been described in terms of a semiconductor substrate or a semiconductor substrate, it should be understood that the described invention could be used to dice or score any type of substrate which would be desirable to have a single pass, dry-in, dice, clean/rinse and dry-out process applied.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Method of dicing a substrate comprising:
placing a substrate in a substrate dicing system;
forming a meniscus between a proximity head and a first surface of the substrate, the proximity head including:
  a first proximity head surface including:
    a first plurality of outlet ports; and
    a first plurality of inlet ports including:
      a first portion of the first plurality of inlet ports being coupled to an at least one process liquid source; and
      a second portion of the first plurality of inlet ports being coupled to a tensio-active substance source, the second portion of the first plurality of inlet ports being disposed along a periphery of the first plurality of outlet ports; and
    the first plurality of outlet ports being disposed along a periphery of the first portion of the first plurality of inlet ports, the first plurality of outlet ports being coupled to a vacuum source;
dicing the substrate at a desired dicing location and simultaneously capturing any particles and contaminants generated by dicing the substrate within the meniscus, the meniscus including the desired dicing location; and
moving the meniscus in a desired dicing direction.

2. The method of claim 1, wherein the first surface of the proximity head being substantially parallel to the first surface of the substrate, the proximity head capable of being moved relative to the first surface of the substrate.

3. The method of claim 1, wherein moving the meniscus in the desired dicing direction includes drying the first surface of the substrate.

4. The method of claim 1, wherein dicing the substrate includes a partial dicing.

5. The method of claim 1, wherein dicing the substrate includes applying a laser to the desired dicing location.

6. The method of claim 5, wherein applying the laser includes applying the laser through the meniscus.

7. The method of claim 5, wherein the meniscus is an annular meniscus and includes a dry central region and wherein applying the laser includes applying the laser through dry central region of the meniscus.

8. The method of claim 1, wherein dicing the substrate includes a full dicing.

9. The method of claim 8, further comprising forming a second meniscus between a second surface of the substrate and a second proximity head, the second surface being opposite from the first surface of the substrate.

10. The method of claim 9, wherein dicing the substrate at the desired dicing location includes simultaneously capturing any particles and contaminants generated by dicing the substrate within the second meniscus.

11. The method of claim 9, wherein moving the first meniscus in the desired dicing direction includes moving the second meniscus.

12. The method of claim 8, wherein dicing the substrate includes:
applying a laser to the desired dicing location; and
absorbing the laser in a laser absorbing target near the second surface of the substrate.

* * * * *